(12) United States Patent
Pleskach et al.

(10) Patent No.: US 7,513,031 B2
(45) Date of Patent: *Apr. 7, 2009

(54) METHOD FOR FORMING AN INDUCTOR IN A CERAMIC SUBSTRATE

(75) Inventors: Michael D. Pleskach, Orlando, FL (US); Andrew J. Thomson, Indialantic, FL (US)

(73) Assignee: Harris Corporation, Melbourne, FL (US)

( * ) Notice: Subject to any disclaimer, the term of this patent is extended or adjusted under 35 U.S.C. 154(b) by 285 days.

This patent is subject to a terminal disclaimer.

(21) Appl. No.: 11/142,638

(22) Filed: Jun. 1, 2005

(65) Prior Publication Data

US 2005/0229385 A1 Oct. 20, 2005

Related U.S. Application Data

(62) Division of application No. 10/657,054, filed on Sep. 5, 2003, now Pat. No. 6,990,729.

(51) Int. Cl.
  *H01F 7/06* (2006.01)
(52) U.S. Cl. .................... 29/606; 29/602.1; 29/604; 156/89.11; 156/89.12; 156/250; 336/176; 336/200; 336/229
(58) Field of Classification Search ............ 29/602.1, 29/604–606; 336/176, 200, 229; 156/89.11, 156/89.1, 250
See application file for complete search history.

(56) References Cited

U.S. PATENT DOCUMENTS

| 3,581,243 A | 5/1971 | Alford |
| 3,681,716 A | 8/1972 | Chiron et al. |
| 4,638,271 A | 1/1987 | Jecko et al. |
| 4,967,171 A | 10/1990 | Ban et al. |

(Continued)

FOREIGN PATENT DOCUMENTS

EP  0 754 660 A1  1/1997

(Continued)

OTHER PUBLICATIONS

U.S. Appl. No. 10/810,952, filed Mar. 26, 2004, Pleskach et al.

(Continued)

*Primary Examiner*—Paul D Kim
(74) *Attorney, Agent, or Firm*—Darby & Darby PC; Robert J Sacco

(57) ABSTRACT

A method for making an embedded toroidal inductor (118) includes forming in a ceramic substrate (100) a first plurality of conductive vias (102) radially spaced a first distance from a central axis (101) so as to define an inner circumference. A second plurality of conductive vias (104) is formed radially spaced a second distance about the central axis so as to define an outer circumference. A first plurality of conductive traces (110) forming an electrical connection between substantially adjacent ones of the first and second plurality of conductive vias is formed on a first surface (106) of the ceramic substrate. Further, a second plurality of conductive traces (110) forming an electrical connection between circumferentially offset ones of the first and second plurality of conductive vias is formed on a second surface of the ceramic substrate opposed from the first surface to define a three dimensional toroidal coil.

4 Claims, 8 Drawing Sheets

U.S. PATENT DOCUMENTS

| | | | |
|---|---|---|---|
| 3,614,554 A | | 10/1991 | Shield et al. |
| 5,070,317 A | | 12/1991 | Bhagat |
| 5,191,699 A | | 3/1993 | Ganslmeier et al. |
| 5,220,488 A | | 6/1993 | Denes |
| 5,430,613 A | | 7/1995 | Hastings et al. |
| 5,479,695 A | | 1/1996 | Grader et al. |
| 5,714,112 A | | 2/1998 | Hazeyama et al. |
| 5,781,091 A | | 7/1998 | Krone et al. |
| 5,802,702 A | * | 9/1998 | Fleming et al. ............... 29/608 |
| 5,959,846 A | | 9/1999 | Noguchi et al. |
| 6,054,914 A | | 4/2000 | Abel et al. |
| 6,094,123 A | | 7/2000 | Roy |
| 6,148,500 A | * | 11/2000 | Krone et al. ............... 29/602.1 |
| 6,160,469 A | | 12/2000 | Liberatore et al. |
| 6,198,374 B1 | | 3/2001 | Abel |
| 6,249,039 B1 | | 6/2001 | Harvey et al. |
| 6,292,084 B1 | | 9/2001 | Choi et al. |
| 6,303,971 B1 | | 10/2001 | Rhee |
| 6,445,271 B1 | | 9/2002 | Johnson |
| 6,498,557 B2 | | 12/2002 | Johnson |
| 6,535,098 B1 | | 3/2003 | Yeo et al. |
| 6,542,352 B1 | | 4/2003 | DeVoe et al. |
| 6,847,282 B2 | * | 1/2005 | Gomez et al. ............... 336/200 |
| 6,914,513 B1 | * | 7/2005 | Wahlers et al. ............... 336/233 |
| 7,196,607 B2 | * | 3/2007 | Pleskach et al. ............. 336/200 |

FOREIGN PATENT DOCUMENTS

| | | |
|---|---|---|
| EP | 1 089 374 A2 | 4/2001 |
| EP | 1 108 533 | 6/2001 |
| JP | 56-123102 | 9/1981 |
| JP | 05-211402 | 8/1983 |
| JP | 07-015218 | 1/1995 |
| JP | 08-154006 | 6/1996 |
| JP | 08 307117 | 11/1996 |
| JP | 10/190321 | 7/1998 |
| JP | 2000307362 | 11/2000 |
| WO | WO 01-01453 A2 | 1/2001 |

OTHER PUBLICATIONS

U.S. Appl. No. 11/041,328, filed Jan. 24, 2005, Pleskach et al.

Itoh, T.; et al: "Metamaterials Structures, Phenomena and Applications" IEEE Transactions on Microwave Theory and Techniques; Apr. 2005. Online Retrieved from the Internet: URL:www.mtt.org/publications/Transactions/CFP_Metamaterials.pdf>.

Kiziltas, G.; et al: "Metamaterial design via the density method" IEEE Antennas and Propagation Society Int'l Symposium 2002, vol. 1, Jun. 16, 2002 pp. 748-751, Piscataway.

Salahun, E.; et al: "Ferromagnetic composite-based and magnetically-tunable microwave devices" IEEE MTT-S Microwave Symposium Digest, vol. 2, Jun. 2, 2002 pp. 1185-1188.

* cited by examiner

METHOD FOR FORMING AN INDUCTOR IN A CERAMIC SUBSTRATE

CROSS REFERENCE TO RELATED APPLICATIONS

This is a division of application Ser. No. 10/657,054 filed Sep. 5, 2003, now U.S. Pat. No. 6,990,729.

BACKGROUND

1. Statement of the Technical Field

The inventive arrangements relate generally to inductors and more particularly to toroidal inductors.

2. Description of the Related Art

Inductors are passive electronic components that store energy in the form of a magnetic field. Every conductor has a certain amount of inductance associated therewith. In order to obtain higher values of inductance, the wire can be formed into a loop or coil. The amount of inductance attributable to a particular inductor device is generally proportional to the number of turns in the coil, the radius of the coil and the type of material around which the coil is wound.

For a particular inductor having a particular number of turns and a particular coil radius it is well known that an air core will result in the least inductance because it has a permeability of 1.0 (the terms permeability and permittivity as used herein should be understood to mean relative permeability and relative permittivity, respectively). Other types of dielectric core materials will behave similarly if they also have a relative permeability close to 1.0. Conversely, ferromagnetic materials, which have higher permeability values, are often used as core materials to increase the inductance achieved for a particular coil configuration.

Inductors can be wound around cores having a variety of shapes ranging from simple cylindrical rods to donut-shaped toroids. Toroids are known to provide certain advantages since, for a given core material and number of turns, they provide a higher inductance as compared to solenoidal (rod-shaped) cores. Toroids also have the advantage of substantially containing the magnetic field produced by the inductor within the core region so as to limit RF leakage and avoid coupling and interference with other nearby components.

In miniature RF circuitry, inductors often tend to be implemented as planar spirals formed directly on the surface of an RF substrate. However, such inductors suffer from a serious drawback in that they do not substantially contain the magnetic field that they produce. In contrast, toroidal inductors effectively contain the magnetic field within a region defined by the core of the toroid. However, implementation of toroids in miniaturized RF circuitry has presented practical difficulties that have typically required them to be implemented as surface mount components.

While surface mount components work well, the circuit board real estate required for such components has become a significant factor contributing to the overall size of RF systems. In fact, passive surface mount devices can typically comprise 80% of a substrate surface area. This causes the surface area of the substrate to be large, while the thickness remains relatively small. This is not an effective use of board real estate.

U.S. Pat. No. 5,781,091 to Krone, et al discloses an electronic inductive device and method for manufacturing same in a rigid copper clad epoxy laminate. The process involves drilling a series of spaced holes in an epoxy laminate, etching the copper cladding entirely off the board, positioning epoxy laminate over a second laminate, positioning a toroidal ferromagnetic core within each of the spaced holes, and filling the remainder of each hole with a fiber-filled epoxy. This technique involves numerous additional processing steps that are not normally part of the conventional steps involved in forming a conventional epoxy PWB. These additional steps naturally involve further expense. Further, such techniques are poorly suited for use with other types of substrates, such as ceramic types described below.

Glass ceramic substrates calcined at 850~1,000 C are commonly referred to as low-temperature co-fired ceramics (LTCC). This class of materials have a number of advantages that make them especially useful as substrates for RF systems. For example, low temperature 951 co-fire Green Tape™ from Dupont® is Au and Ag compatible, and it has a thermal coefficient of expansion (TCE) and relative strength that are suitable for many applications. Other LTCC ceramic tape products are available from Electro-Science Laboratories, Inc. of 416 East Church Road, King of Prussia, Pa 19406-2625, USA. Manufacturers of LTCC products typically also offer metal pastes compatible with their LTCC products for defining metal traces and vias.

The process flow for traditional LTCC processing includes (1) cutting the green (unfired) ceramic tape from roll, (2) removing the backing from the green tape, (3) punching holes for electrical vias, (3) filling via holes with conductor paste and screening print patterned conductors, (4) stacking, aligning and laminating individual tape layers, (4) firing the stack to sinter powders and densify, and (4) sawing the fired ceramic into individual substrates.

LTCC processing requires that materials that are co-fired are compatible chemically and with regard to thermal coefficient of expansion (CTE). Typically, the range of commercially available LTCC materials have been fairly limited. For example, LTCC materials have been commercially available in only a limited range of permittivity values and have not generally included materials with permeability values greater than one. Recently, however, developments in metamaterials have begun to expand the possible range of materials that can be used with LTCC. Further, new high-permeability ceramic tape materials that are compatible with standard LTCC processes have become commercially available.

SUMMARY OF THE INVENTION

The invention concerns an inductor and a method for forming an inductor. The method includes forming in a ceramic substrate a first plurality of conductive vias radially spaced a first distance from a central axis so as to define an inner circumference. A second plurality of conductive vias is formed radially spaced a second distance about the central axis so as to define an outer circumference. A first plurality of conductive traces forming an electrical connection between substantially adjacent ones of the first and second plurality of conductive vias is formed in a first plane defined orthogonal to said central axis. Further, a second plurality of conductive traces forming an electrical connection between circumferentially offset ones of the first and second plurality of conductive vias is formed in a second plane spaced from said first plane and defined orthogonal to said central axis. The conductive vias and the conductive traces together define a three dimensional toroidal coil.

The method can also include the step of firing the ceramic substrate after the conductive vias and the traces have been formed. According to one aspect of the invention, the method can include the step of forming at least a toroid shaped core region of the ceramic substrate, defined within the toroidal coil. The core region can be formed of a ceramic material having at least one electrical characteristic different from at least one other portion of the ceramic substrate. For example, the electrical characteristic can be permeability. The high permeability portion of the substrate can be limited to the core region only, or it can include an entire substrate layer. Advantageously, the permeability of at least the high permeability region can be greater than one. Further, the ceramic material can be selected to be a low-temperature co-fired ceramic (LTCC) material.

According to another aspect, the method can include forming the ceramic substrate by stacking a plurality of unfired ceramic layers, and selecting at least one of the unfired ceramic layers to have a permeability greater than one. In that case, the invention can also include the steps of positioning a ceramic layer having a permeability greater than one so as to be at least partially contained within a toroid shaped core region of the ceramic substrate. Further, the invention can include the step of firing the ceramic substrate after the conductive vias and the conductive traces have been formed.

Notably, a toroid shaped area of a different higher permeability can be located on the same layer as a standard low permeability LTCC tape layer. However, this can involve additional processing steps. In order to avoid these additional processing steps, whole layers can be composed of a relatively higher permeability as compared to standard LTCC tape layers, which typically have a permeability of about approximately one. Further, all of the LTCC substrate layers can be formed of LTCC layers having a permeability greater than about one. A significant advantage can be gained in this regard since these LTCC structures can be constructed without any change to the conventional LTCC processing techniques. If additional processing steps are acceptable, then the LTCC tape layers can have different permeability values, or selected tape layers can be formed with a high permeability toroidal core area integrated in a lower permeability tape.

According to another aspect, the method can include forming a third plurality of conductive vias radially spaced a third distance from the central axis so as to define a second inner circumference, where the third distance is less than the first distance. Further, a fourth plurality of conductive vias can be formed radially spaced a fourth distance about the central axis so as to define a second outer circumference with the fourth distance larger than the second distance. A third plurality of conductive traces can also be formed disposed in a third plane defined orthogonal to the central axis. The third plurality of conductive traces can form an electrical connection between substantially radially adjacent ones of the third and fourth plurality of conductive vias. Finally, a fourth plurality of conductive traces can be disposed in a fourth plane spaced from the first plane and defined orthogonal to the central axis to define an electrical connection between circumferentially offset ones of the third and fourth plurality of conductive vias to define a second three dimensional toroidal coil.

If a second three dimensional coil is formed in this way, the method can also include the step of forming an electrical connection between the first and second three-dimensional conductive toroidal coils. For example, the electrical connection can be provided in such a way that the first and second toroidal coils generate a magnetic field in a common direction.

The invention can also comprise an inductor disposed within a ceramic substrate. A first plurality of conductive vias are disposed in a ceramic substrate radially spaced a first distance from a central axis so as to define an inner circumference. A second plurality of conductive vias are disposed radially spaced a second distance about the central axis so as to define an outer circumference. Further, a first plurality of conductive traces is disposed in a first plane defined orthogonal to the central axis so as to form an electrical connection between substantially adjacent ones of the first and second plurality of conductive vias. Finally, a second plurality of conductive traces is disposed in a second plane spaced from said first plane and defined orthogonal to said central axis. The second plurality of conductive traces form an electrical connection between circumferentially offset ones of the first and second pluralities of conductive vias. The combined conductor structure defines a three dimensional toroidal coil.

According to one aspect of the invention, the ceramic substrate is formed of a material compatible for cofiring with the conductive vias and the conductive traces. Further, at least a toroid shaped core region of the ceramic substrate, defined within the toroidal coil, is formed of a ceramic material having at least one electrical characteristic different from at least one other portion of the ceramic substrate. For example, the electrical characteristic can be permeability. If the electrical characteristic is permeability, the permeability value is advantageously greater than one. Further, the ceramic material is advantageously low-temperature co-fired ceramic (LTCC) material.

According to one aspect of the invention, the ceramic substrate is comprised of a cofired stack of ceramic layers, and at least one of the ceramic layers has a permeability greater than one. In that case, at least one ceramic layer having a permeability greater than one is positioned at least partially contained within a toroid shaped core region of the ceramic substrate defined within the toroidal coil. Further, the ceramic substrate, the conductive vias and the conductive traces are compatible for co-firing. Terminal connections can be located at opposing ends of the toroidal coil for connecting the inductor to a circuit. According to an alternative embodiment, all of the LTCC tape layers can have a relatively high permeability, i.e. greater than approximately 1.

According to yet another aspect, the invention can include a printed circuit board. The printed circuit board can be comprised of a ceramic substrate and a ceramic toroidal core integral to said ceramic substrate. This toroidal core structure can be created simultaneously with the printed circuit board using standard ceramic substrate fabrication processes. Consequently, no additional processing steps are needed for the creation of the toroidal structure. A conductive metal coil comprising a plurality of turns is disposed about said ceramic toroidal core. Further, the ceramic toroidal core is integrally formed with said ceramic substrate as a result of a co-firing process. Notably, at least the ceramic toroidal core can be comprised of a ceramic material that has a permeability greater than a second ceramic material comprising at least one other portion of the ceramic substrate.

According to yet another aspect, the invention can include a method for forming an inductor in a ceramic substrate. The method can include forming a conductive metal coil comprising a plurality of turns about an unfired ceramic toroidal core region defined within an unfired ceramic substrate. The ceramic toroidal core region, the ceramic substrate, and the conductive metal coil can thereafter be co-fired to form an integral ceramic substrate structure with the conductive metal coil at least partially embedded therein. According to another aspect of the invention, the metal coil and the ceramic toroidal core region can be entirely embedded within the ceramic substrate. The ceramic toroidal core region can be formed of a ceramic material having a permeability greater than one.

DETAILED DESCRIPTION OF THE PREFERRED EMBODIMENTS

Figure 5:
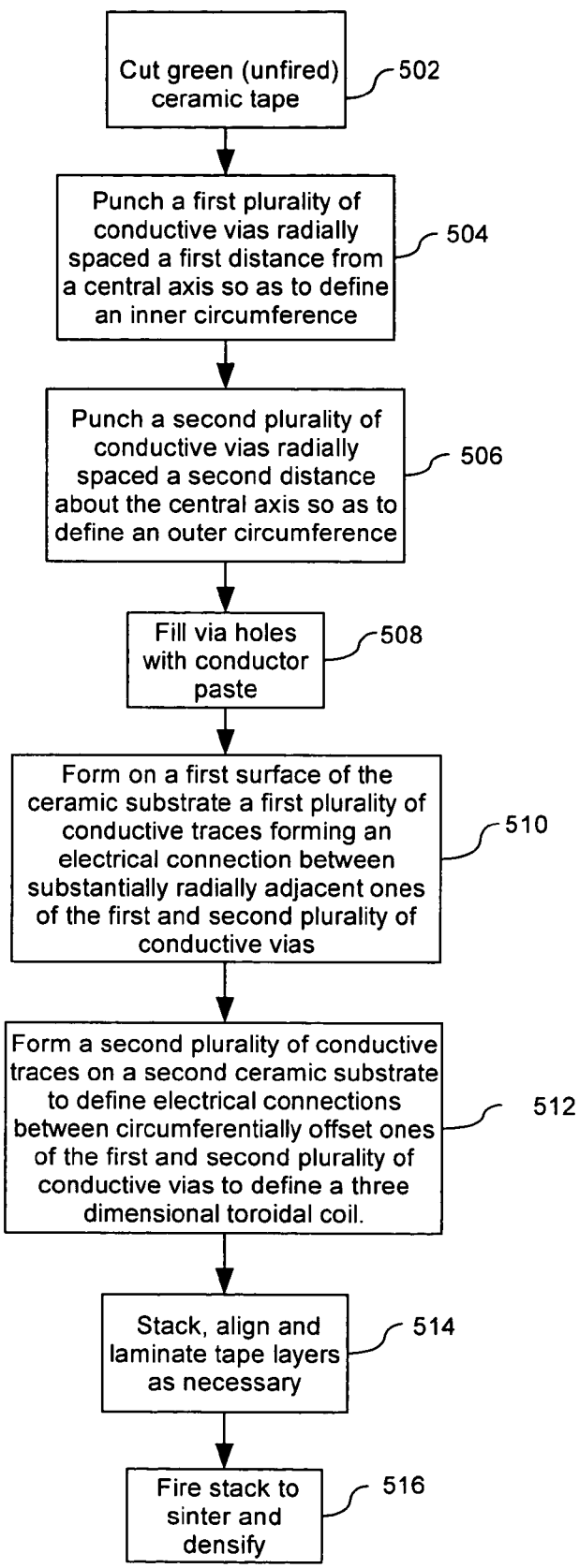
FIG. 5 is a flow chart that is useful for understanding the method of making the present invention.

The invention concerns a toroidal inductor integrated within a ceramic substrate and a method of making same. The method shall be described in reference to FIGS. 1-2, and the flowchart in FIG. 5. The method can begin with step 502 by forming a suitably sized piece of unfired ceramic tape 100. The ceramic tape 100 can be any of a variety of commercially available glass ceramic substrates designed to be calcined at 800° C. to 1,050° C. This class of materials is commonly referred to as low-temperature co-fired ceramics (LTCC). Such LTCC materials have a number of advantages that make them especially useful as substrates for RF systems. For example, low temperature 951 co-fire Green Tape™ from Dupont® is Au and Ag compatible, and it has a thermal coefficient of expansion (TCE) and relative strength that are suitable for many applications. Other similar types of ceramic tapes can also be used. The size of the ceramic tape can be determined by a variety of factors depending upon the particular application. For example, if the toroidal inductor is to form part of a larger RF circuit, the ceramic tape can be sized to accommodate the RF circuit in which the toroidal inductor forms a component.

Figure 1:
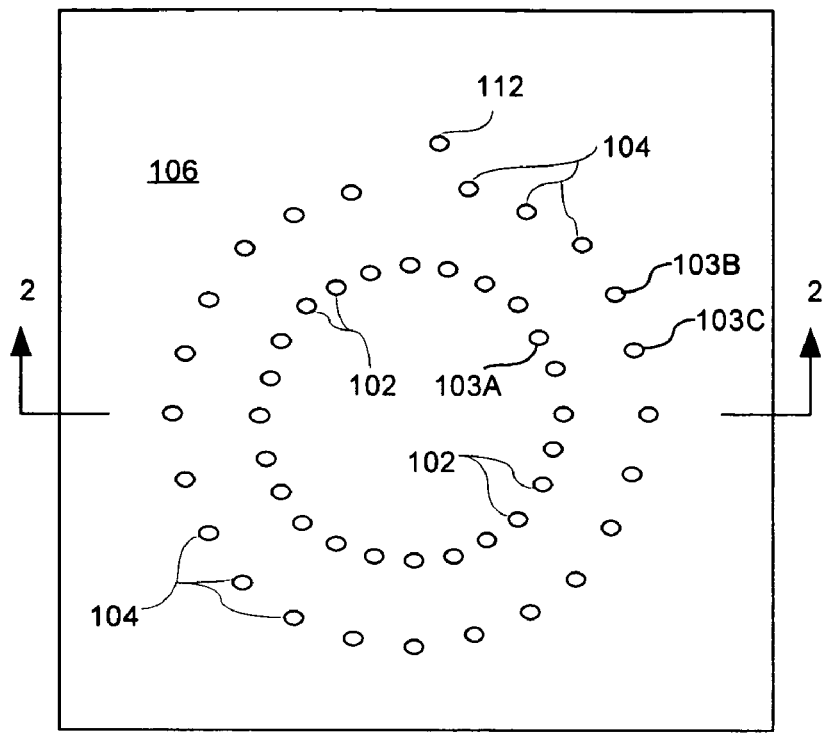
FIG. 1 a is top view of a ceramic substrate with vias formed therein that is useful for understanding the method of forming a toroidal inductor, the present invention.
Figure 2:
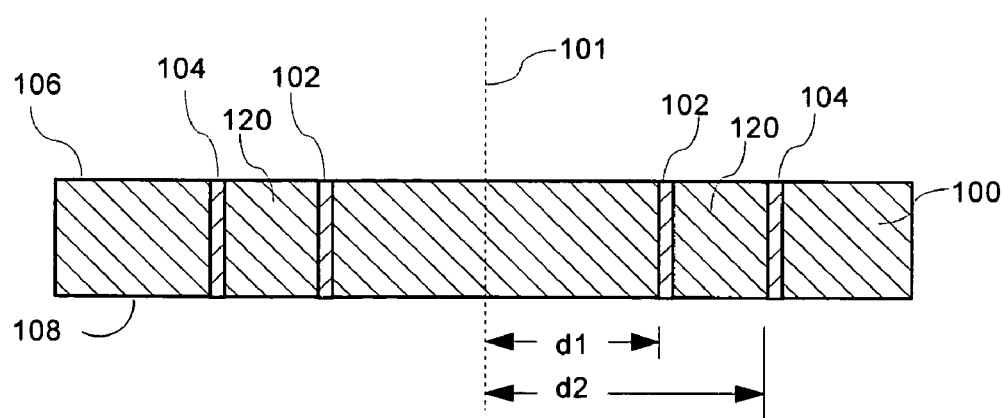
FIG. 2 is a cross-sectional view of the substrate of FIG. 1, taken along lines 2-2.

A first plurality of conductive vias 102 can be formed in the unfired ceramic tape 100. This step can be performed using conventional techniques, which include punching holes in the unfired ceramic tape 100 in step 504 and filling the via holes in step 508 with conductive paste. As shown in FIGS. 1 and 2, the first plurality of conductive vias 102 can be radially spaced a first distance d1 from a central axis 101 so as to define an inner circumference of a toroidal inductor. In steps 506 and 508, a second plurality of conductive vias 104 can be similarly formed radially spaced a second distance d2 about the central axis so as to define an outer circumference. As shown in FIG. 2, the vias can extend substantially between opposing surfaces 106, 108 of the ceramic tape 100.

Figure 3:
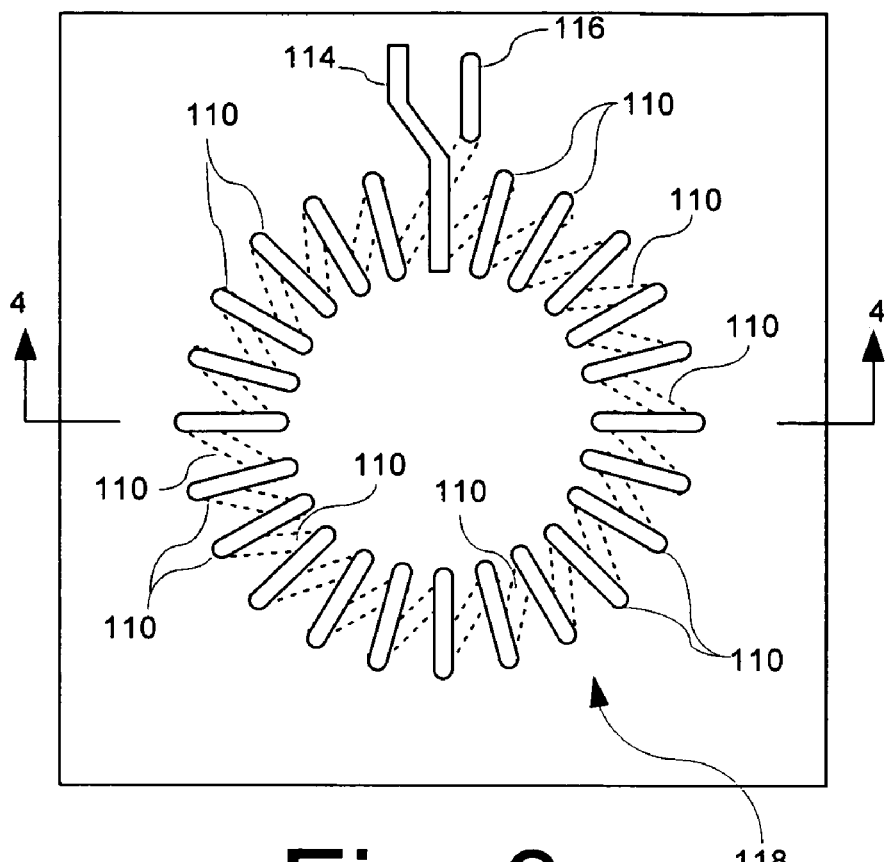
FIG. 3 is a top view of the substrate in FIG. 1, after conductive traces and a second layer has been added to form a toroidal inductor.
Figure 4:
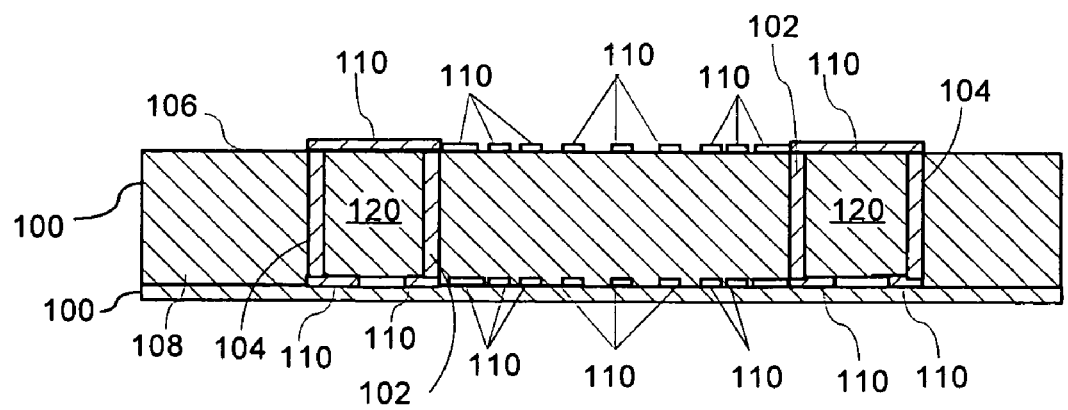
FIG. 4 is a cross-sectional view of the substrate in FIG. 3, taken along lines 4-4.

Referring now to FIGS. 3 and 4, the process can continue in step 510 by disposing a plurality of conductive traces 110 on ceramic tape 100. The conductive traces on surface 106 form electrical connections between respective ones of the first and second plurality of conductive vias that are substantially radially adjacent. In step 5.12, a second plurality of conductive traces 110 is provided on surface 108 of a second ceramic tape 100. The second ceramic tape 100 can also be formed of an LTCC material. The second plurality of conductive traces 110 is arranged so that when the two ceramic tape layers are aligned and stacked as shown, the traces 110 on surface 108 will provide an electrical connection between circumferentially offset ones of the first and second pluralities of conductive vias.

The conductive traces 110 can be formed of any suitable conductive paste or ink that is compatible with the co-firing process for the selected LTCC material. Such materials are commercially available from a variety of sources. Further, it should be noted that for the purposes of consistency with standard LTCC processing, two layers of ceramic tape 100 are shown in FIG. 4 with traces 110 disposed on one side of each tape only. However, the invention is not so limited. Those skilled in the art will appreciate that it is possible for traces 110 to instead be disposed on opposing sides of a single layer of ceramic tape 100 and such alternative arrangements are intended to be within the scope of the invention. In step 514, the various LTCC layers can be stacked and aligned with one another utilizing conventional processing techniques.

Figure 6:
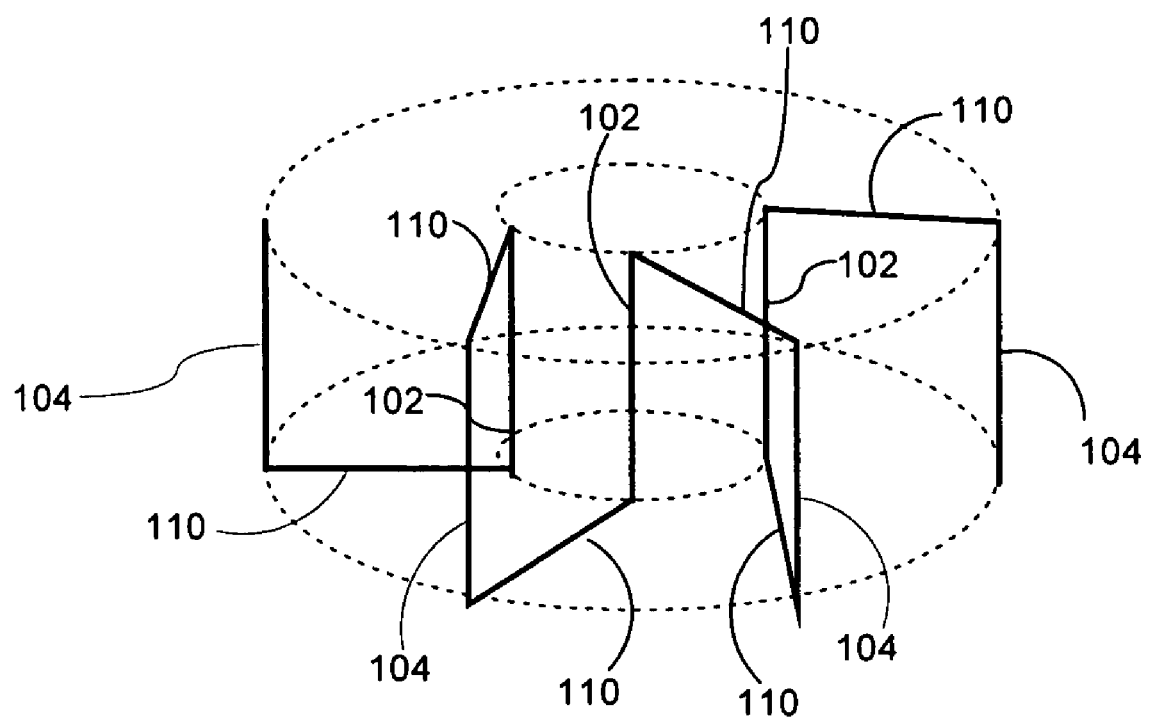
FIG. 6 is a schematic representation that is useful for understanding the structure of the toroidal inductor in FIGS. 1-4.

The conductive vias 102, 104 and the conductive traces 110 together define a three dimensional conductive toroidal coil 118, which is best illustrated in FIG. 3. The toroidal coil is formed by the three-dimensional combination of the vias 102, 104, and the conductive traces 110. The schematic representation in FIG. 6 is also useful for understanding the toroidal coil structure resulting from the arrangement described relative to FIGS. 1-4. In this regard, it should be understood that the invention herein is not limited to the precise arrangement or pattern of vias 102, 104 and traces 110 that are illustrated in FIGS. 1-4. Instead, any pattern of vias and traces formed in the ceramic tape layer can be used provided that it generally results in a substantially toroidal coil arrangement of the kind similar to that illustrated in FIG. 6, it being understood that many minor variations are possible.

For example, it is stated above that the conductive traces 110 on surface 106 form electrical connections between respective ones of the first and second plurality of conductive vias that are substantially radially adjacent. Vias 103A and 103B are examples of radially adjacent vias. However, it should be noted that radially adjacent conductive vias, as that term is used herein, are not necessarily precisely aligned radially. Such radially adjacent vias can also include vias that are offset circumferentially from one another to some degree. In contrast, vias 103A and 103C represent circumferentially offset vias. As can be seen in FIG. 1, circumferentially offset vias are not aligned radially. The invention is not intended to be limited to any specific geometry of conductive traces 110 and vias provided that the combination of these elements define a continuous toroidal coil.

Referring to FIGS. 1 and 3, one or more additional vias 112 and additional traces 114, 116 can be provided to define a set of electrical contacts for the toroidal inductor. Once all of the vias 102, 104 and traces 110 are completed, the ceramic tape 100, vias and traces can be fired together in step 516 in accordance with a temperature and time appropriate for the particular type of ceramic tape.

The process can also include the step of forming at least a toroid shaped core region 120 within the ceramic tape 100 that has at least one electrical characteristic different from at least one other portion of the ceramic substrate. For example, the electrical characteristic can be permeability or permittivity. Advantageously, the permeability of at least the toroid shaped core region can be increased by forming at least a portion of the core region 120 of a low-temperature co-fired ceramic (LTCC) material that has a permeability greater than one. According to a preferred embodiment, at least the core region can have a permeability substantially greater than one. For example, the permeability in the core region, using current technology, can range from about 150 to 400. However, the invention is not limited in this regard. Instead, high permeability can include values greater than about 1.0.

Figure 4A:
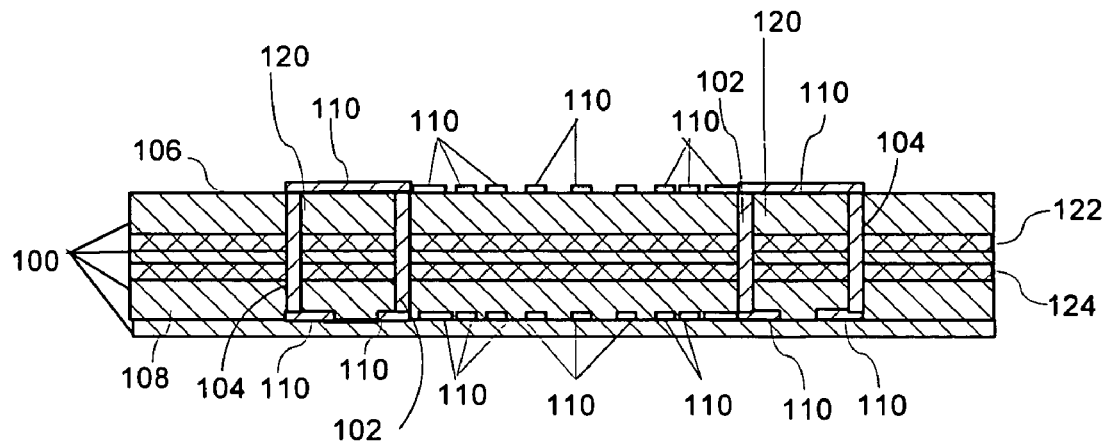
FIG. 4A is a cross-sectional view a first alternative embodiment of the toroidal inductor in FIG. 4, taken along lines 4-4.

This high permeability core region can be formed by any suitable means. For example, the high permeability core region can be formed by stacking one or more layers of unfired high permeability ceramic tape in conjunction with traditional non-ferrous ceramic tape having a permeability of one as shown in FIG. 4A. The high permeability layers are advantageously arranged to intersect the core region. In an alternative embodiment, the substrate can also be formed so that the high permeability region exclusively includes the core region. Other LTCC tape layers not coincident with the core region can also be formed of high permeability material. For example, all of the layers could be formed from high permeability LTCC tape layers.

As illustrated in FIG. 4A, the unfired ceramic tapes 122, 124 can be stacked together with a plurality of unfired ceramic tape layers 100. According to one embodiment, ceramic tapes 122, 124 can have a higher relative permeability as compared to ceramic tape layers 100. The unfired tape layers 122,124 can be positioned to ensure that at least a portion of them will be contained in the core region 120. Unfired tape layers 122, 124 can be any ceramic tape compatible with the remaining tape layers 100 in the stack. For example a high permeability LTCC tape is commercially available from Electro-Science Laboratories, Inc., of 416 East Church Road, King of Prussia, Pa 19406-2625, USA. In particular, reference is made to product number ESL 40010 that has a permeability of 150-400. According to an alternative embodiment, all of the tape layers can be formed of high permeability material.

Figure 4B:
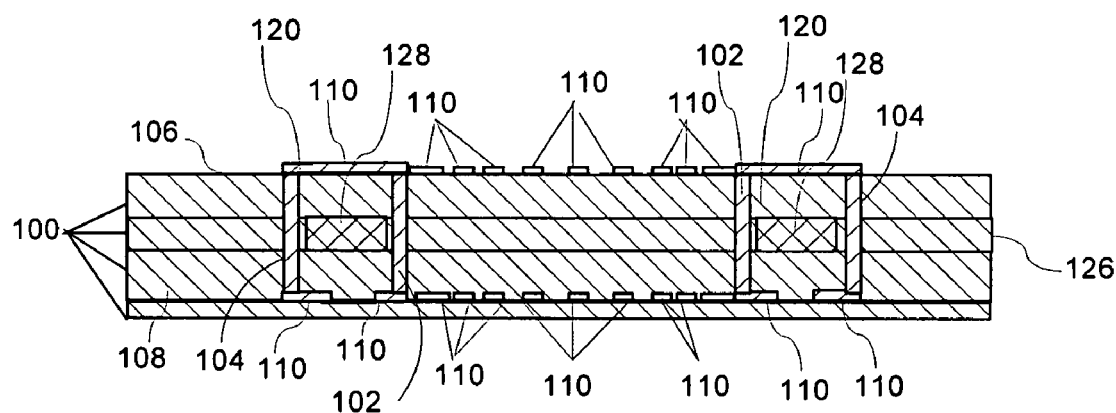
FIG. 4B is a cross-sectional view a second alternative embodiment of the toroidal inductor in FIG. 4, taken along lines 4-4.
Figure 4C:
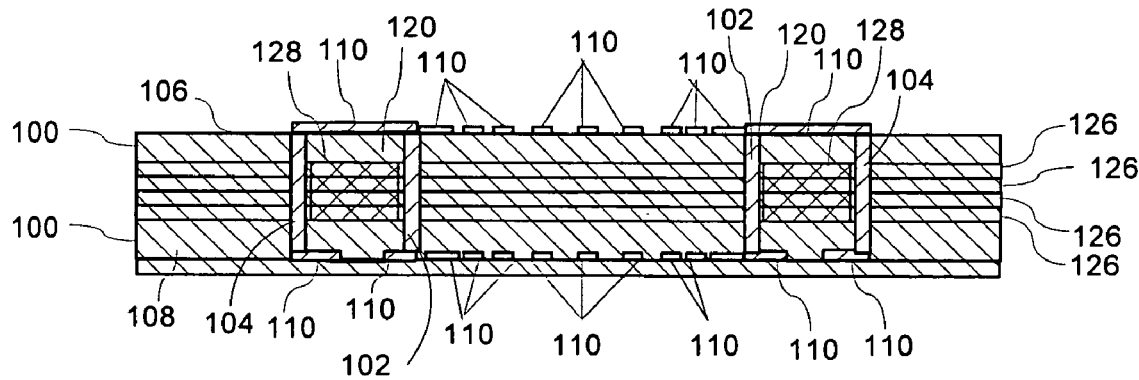
FIG. 4C is a cross-sectional view a third alternative embodiment of the toroidal inductor in FIG. 4, taken along lines 4-4.

FIG. 4B illustrates an arrangement in which an unfired ceramic tape layer 126 is combined with a plurality of unfired tape layers 100. Further, tape layer 126 can include portions 128 intersecting the core region 120. Portions 128 can have a higher permeability as compared to the remainder of tape 126 and tapes 100. FIG. 4C illustrates a similar arrangement where a plurality of unfired tape layers 126 are stacked with unfired tape layers 100 as shown. The stack can be fired after the formation of conductive vias and traces as previously described relative to FIG. 1.

Figure 7:
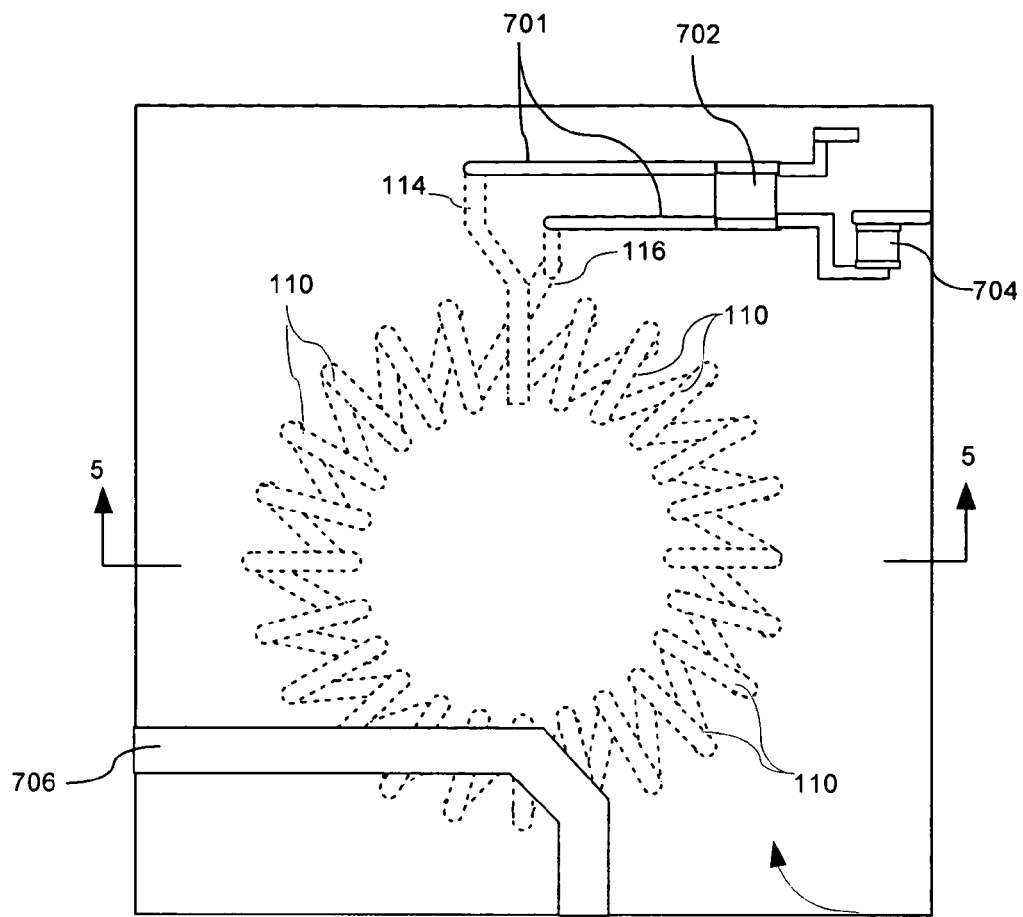
FIG. 7 is a top view of a toroidal inductor illustrating an alternative inventive arrangement.
Figure 8:
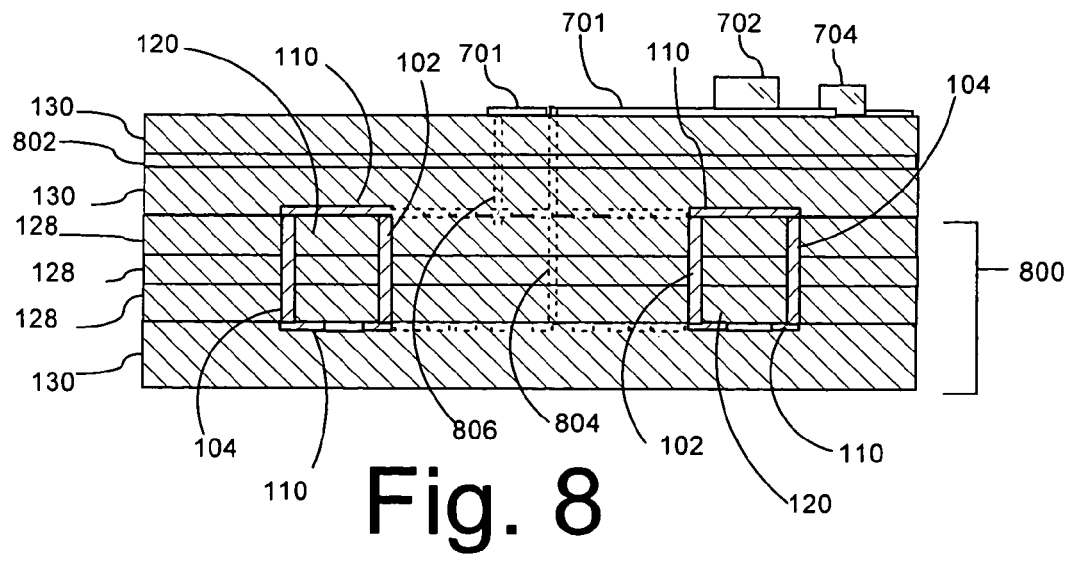
FIG. 8 is a cross-sectional view of the toroidal inductor in FIG. 7, taken along lines 8-8.

Referring now to FIGS. 7 and 8, there is shown a further alternative embodiment of the invention in which additional ceramic layers are included. In FIGS. 7 and 8, structure common to FIGS. 1-4 is identified using like reference numerals. In FIGS. 7 and 8, one or more layers of unfired ceramic tape 128 can be provided. Vias 102, 104 and traces 110 can be formed in the stack 800 in the manner previously described relative to FIGS. 1-4. One or more of the unfired ceramic tape layers 128 can alternatively be configured as describe relative to FIGS. 4A-4C with areas of high permeability tape or high permeability portions intersecting the core region 120. One or more additional layers of ceramic tape 130 can be disposed above and/or below the stack 800 to completely embed the toroidal inductor 718 within the ceramic material.

In some instances, it may be advantageous to make use of the surface area above and/or below the toroidal inductor 718 for the placement of circuit traces 701 or other surface mount components 702, 704. The addition of a ceramic layer above the traces 110 can facilitate such placement. In such instances, conductive vias 804, 806 forming an electrical connection to the toroidal inductor 718 can extend to an outer surface of the substrate stack to provide an electrical connection thereto.

In the case of RF circuit boards, it is often important to maintain a predetermined spacing between conductive traces and a ground plane. This is particularly important where the conductive traces define RF transmission lines, such as micro-strip transmission line 706. The presence of the conductive traces 110, vias 102, 104, and any high permeability ceramic substrates beneath the transmission line 706, can create undesirable variations in the characteristic impedance of the line. Accordingly, it can be desirable, although not necessary, to provide at least one conductive layer 802 spaced beneath an outer one of the ceramic tape layers 130.

The conductive layer 802 can define a ground plane that can isolate the various sub-surface structures from the surface mount components and transmission lines. If a conductive layer 802 is provided, suitable openings can be formed to avoid any electrical contact with conductive vias 804, 806. Notably, the toroid maintains most of the magnetic field inside the structure. Accordingly, it is not generally necessary to shield surface components (or other electrical traces) from the toroid. The exception would be electrical traces that define RF transmission lines. In that case, the characteristic impedance of the line can be altered by the presence of discontinuities in the substrate. Further, the high permeability layers used to form the substrate for the toroid may not be suitable substrates for the RF transmission lines. In that case, a ground plane layer can serve to isolate the high permeability layers from the RF transmission line and associated substrate. Another advantage of the toroid structure as compared to planar spiral inductors is that in those instances where a trace needs a ground plane beneath it (i.e. microstrip) the ground plane can be placed anywhere near the toroid without affecting the inductance. In contrast, a ground plane near a planar spiral will greatly degrade the inductance.

As will be apparent from the foregoing, the invention can in one embodiment be comprised of a printed circuit board of a ceramic substrate 128, 130 and a ceramic toroidal core region 120 embedded within the ceramic substrate. The conductive metal coil can be comprised of a plurality of turns about the ceramic toroidal core. The conductive metal coil can be a toroidal inductor 718 defined by the conductive vias 110 and traces 102, 104. The ceramic toroidal core region can be integrally formed with the ceramic substrate as a result of a co-firing process of the ceramic layers, e.g ceramic tapes layer 128, 130 in FIG. 7-8. As noted above, the ceramic toroidal core region can be comprised of a ceramic material that has a permeability greater than a second ceramic material comprising at least one other portion of said ceramic substrate.

Figure 9:
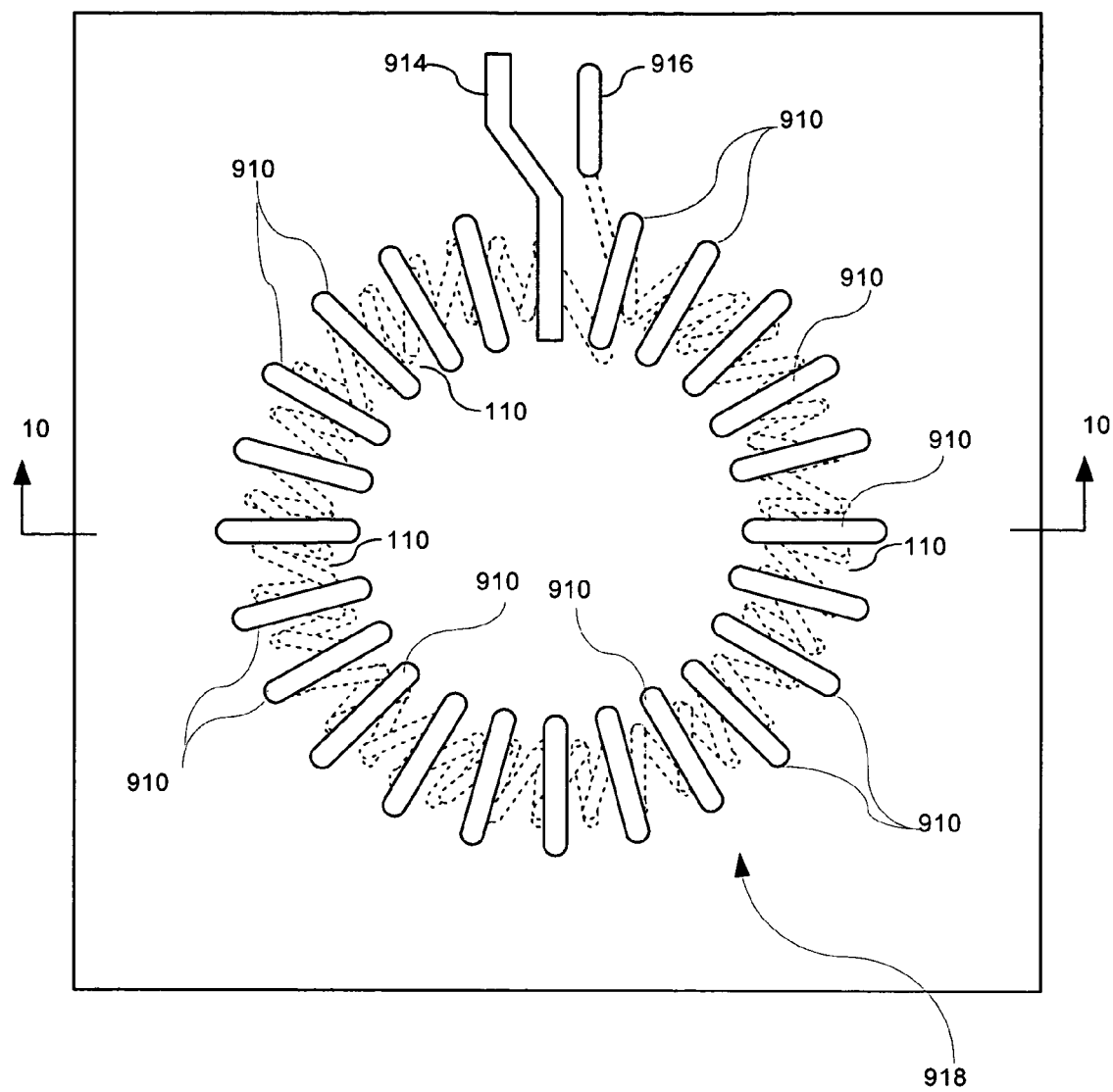
FIG. 9 is a top view of the substrate in FIG. 4, after additional layers and conductive traces have been added to form a multiple layer winding toroidal inductor.

Referring now to FIG. 9 there is shown an alternative embodiment of the invention. In FIG. 9, the structure corresponding to FIG. 4 is identified using like reference numerals. FIG. 9 shows a top view of a substrate similar to the one shown in FIG. 3, after additional layers of ceramic tape, vias 902, 904 and conductive traces 910 have been added to form a second winding layer for the toroidal inductor 918. Toroidal coil 118 is shown in phantom. Each winding layer in FIG. 9 defines a toroidal coil disposed about the ceramic toroidal core 120 and having a coil radius different from an adjacent winding layer. In FIG. 9, traces 110, 910, and vias 102, 104, 902, 904 form a continuous winding that can begin at contact 914 and can end at 916. The winding is formed so that the magnetic field induced by the alternating electric current flowing through the various traces 110, 910, and vias 102, 104, 902, 904 generates a magnetic field in a common direction. For purposes of clarity, traces 910 on a bottom side of the substrate are not shown in FIG. 9.

Figure 10:
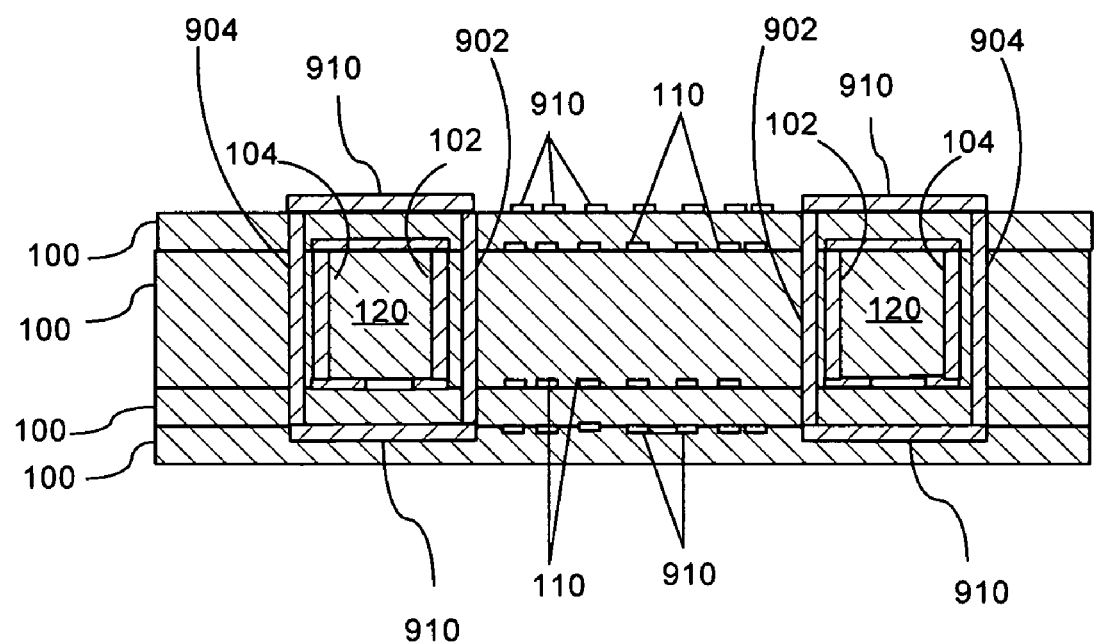
FIG. 10 is a cross-sectional view of the substrate in FIG. 9, taken along lines 10-10.

FIG. 10 is a cross-sectional view of the substrate in FIG. 9, taken along lines 10-10. It may be observed in FIG. 10 that the outer winding layer formed by vias 902, 904 and traces 910 has a coil radius that is greater than the inner winding layer formed by vias 102, 104, and traces 110. Additional winding layers can also be provided by using the techniques described herein.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims.

We claim:

1. A method for forming an inductor in a ceramic substrate, comprising the steps of:
    forming a conductive coil comprising a plurality of turns about an unfired ceramic toroidal core region defined within an unfired ceramic substrate;
    co-firing said ceramic toroidal core region, said ceramic substrate, and said conductive coil to form an integral ceramic substrate structure with said conductive coil at least partially disposed within the integral ceramic substrate structure; and
    disposing a conductive ground plane layer between said conductive coil and an outer surface of said integral ceramic substrate structure.

2. The method according to claim 1, further comprising the step of forming said ceramic toroidal core region of a ceramic material having a permeability greater than one.

3. The method according to claim 1 further comprising the step of forming said conductive coil with a plurality of winding layers, each winding layer defining a toroidal coil disposed about said ceramic toroidal core and having a coil radius different from an adjacent winding layer.

4. The method according to claim 1, wherein said disposing further comprises configuring said conductive ground plane layer to be electrically isolated from said conductive coil.

* * * * *